United States Patent
Hu et al.

(10) Patent No.: US 9,666,152 B2
(45) Date of Patent: May 30, 2017

(54) SHIFT REGISTER UNIT, GATE DRIVING CIRCUIT AND DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Zuquan Hu, Beijing (CN); Guolei Wang, Beijing (CN); Rui Ma, Beijing (CN); Ming Hu, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 651 days.

(21) Appl. No.: 14/235,957

(22) PCT Filed: Jun. 19, 2013

(86) PCT No.: PCT/CN2013/077497
§ 371 (c)(1),
(2) Date: Jan. 29, 2014

(87) PCT Pub. No.: WO2014/153863
PCT Pub. Date: Oct. 2, 2014

(65) Prior Publication Data
US 2016/0180964 A1    Jun. 23, 2016

(30) Foreign Application Priority Data
Mar. 29, 2013    (CN) .......................... 2013 1 0109434

(51) Int. Cl.
*G09G 3/36*    (2006.01)
*G11C 19/28*    (2006.01)

(52) U.S. Cl.
CPC ........... *G09G 3/3677* (2013.01); *G11C 19/28* (2013.01); *G09G 2300/0426* (2013.01);
(Continued)

(58) Field of Classification Search
CPC ... G09G 2300/0426; G09G 2310/0218; G09G 2310/0283; G09G 2310/0286; G09G 2310/08; G09G 3/3677; G11C 19/28
(Continued)

(56) References Cited

U.S. PATENT DOCUMENTS

2008/0266477 A1* 10/2008 Lee ...................... G09G 3/3677
349/46
2009/0167668 A1    7/2009 Kim
(Continued)

FOREIGN PATENT DOCUMENTS

CN    101477836 A    7/2009
CN    101562046 A    10/2009
(Continued)

OTHER PUBLICATIONS

International Preliminary Report on Patentability issued Sep. 29, 2015; PCT/CN2013/077497.
(Continued)

*Primary Examiner* — Dmitriy Bolotin
(74) *Attorney, Agent, or Firm* — Ladas & Parry LLP (57) ABSTRACT

Provided are a shift register unit, a gate driving circuit and a display device, wherein the shift register unit includes: a pull-up module connected to a clock signal line and a signal output terminal; at least two pull-down modules both connected to a low level signal line and the signal output terminal; a control module connected to the pull-up module and the pull-down modules, for controlling the pull-up module to be turned on, so that the pull-up module outputs a high level signal input from the clock signal line to the
(Continued)

signal output terminal, and for controlling the at least two pull-down modules to be turned on alternatively, so that the at least two pull-down modules output a low level signal input from the low level signal line to the signal output terminal, and for controlling one of the at least two pull-down modules to be turned on while controlling the other pull-down modules of the at least two pull-down modules to be discharged. The shift register unit can reduce over-bias of a gate of a pull-down TFT effectively, thus improving stability of the shift register unit.

19 Claims, 7 Drawing Sheets

(52) U.S. Cl.
CPC ............... *G09G 2310/0218* (2013.01); *G09G 2310/0283* (2013.01); *G09G 2310/0286* (2013.01); *G09G 2310/08* (2013.01)

(58) Field of Classification Search
USPC ........................................... 345/100; 377/64
See application file for complete search history.

(56) References Cited

U.S. PATENT DOCUMENTS

| | | | |
|---|---|---|---|
| 2009/0256794 A1* | 10/2009 | Jang | ....................... G11C 19/28 345/100 |
| 2011/0012823 A1 | 1/2011 | Tsai et al. | |
| 2014/0168044 A1 | 6/2014 | Hu et al. | |

FOREIGN PATENT DOCUMENTS

| | | |
|---|---|---|
| CN | 101615431 A | 12/2009 |
| CN | 202502720 U | 10/2012 |
| CN | 103035298 A | 4/2013 |

OTHER PUBLICATIONS

International Search Report dated Dec. 24, 2013; PCT/CN2013/077497.
Second Chinese Office Action dated Jan. 4, 2016; Appln. No. 201310109434.0.
First Chinese Office Action Appln. No. 201310109434.0; Dated Jun. 3, 2015.

* cited by examiner

SHIFT REGISTER UNIT, GATE DRIVING CIRCUIT AND DISPLAY DEVICE

TECHNICAL FIELD

The present disclosure relates to a field of display technology, and particularly to a shift register unit, a gate driving circuit and a display device.

BACKGROUND

Liquid Crystal Displays are now widely used in various display fields, such as family, public places, offices, and personal electronics-related products and the like. A liquid crystal display panel mainly comprises: a liquid crystal cell formed by an array substrate and a color filter substrate, a polarizing sheet and a backlight module or the like. There are a plurality of Thin Film Transistors (TFTs) arranged at intersections of gate lines and data lines, wherein the gate lines control the TFTs to be turned on or turned off, and when a TFT is turned on, a pixel electrode is charged or discharged via a data line; a voltage on the data line controls the magnitude of a voltage applied to liquid crystal molecules and in turn controls the deflection degree of the liquid crystal molecules, so that the light passing through the liquid crystal molecules can display different gray scales. A circuit for driving the gate lines is referred to as a gate driving circuit, and the gate driving circuit outputs scan signals to the gate lines sequentially, and the scan signals are usually generated by shift registers. As continuous development of requirements, sometimes it is necessary that the liquid crystal panel can perform a reverse display, and thus it is required that the shift register for gate driving has a bidirectional scanning function.

Figure 1:
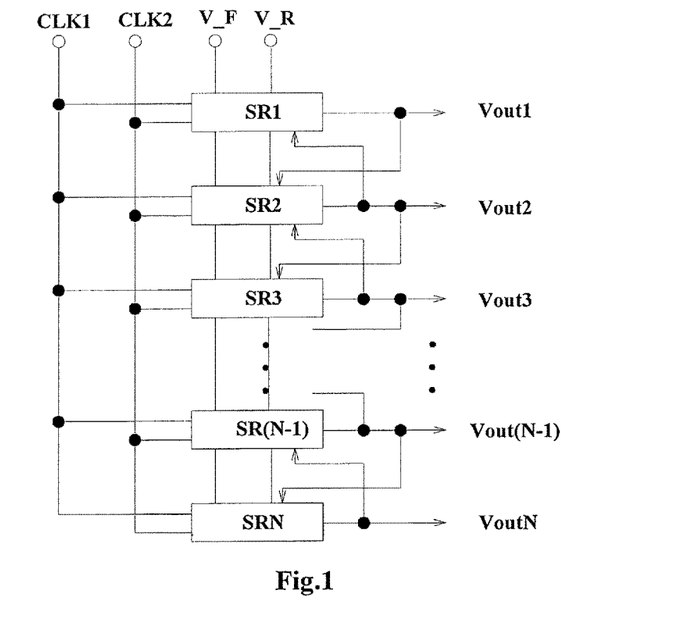
FIG. 1 is a schematic structure diagram of a conventional gate driving circuit commonly known in the prior art.

FIG. 1 shows a schematic structure diagram of a conventional gate driving circuit in the prior art, wherein the gate driving circuit comprises a plurality of stages of shift register units SR1, SR2, . . . , SRN connected in cascade for bidirectional scanning, wherein from SR2 to SRN−1, an output signal of each stage of shift register unit is supplied to a corresponding gate line, and is further input to a previous stage of shift register unit for serving as a Reset signal of the previous stage of shift register unit and to a next stage of shift register unit for serving as a Start signal of the next stage of shift register unit respectively. The gate driving circuit further comprises control signal lines V_F and V_R for controlling a forward scanning and a backward scanning, clock signal lines CLK1 and CLK2, and a low level signal line VSS (not shown) all connected to each stage of shift register unit, and further comprises a start pulse signal line VST (not shown) connected to a first stage of shift register unit SR1. Further, it is unnecessary for an output signal of a $N^{th}$ stage of shift register unit SRN to be supplied to its next stage of shift register unit.

Figure 2:
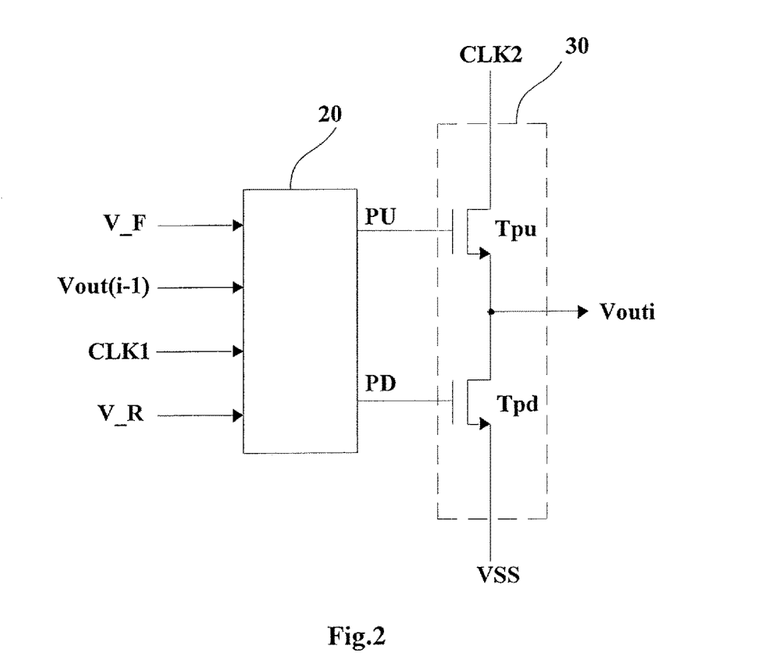
FIG. 2 is a schematic structure diagram of a bidirectional scanning shift register unit commonly known in the prior art.

FIG. 2 shows a schematic structure diagram of a conventional bidirectional scanning shift register unit (i.e., an $i^{th}$ stage of shift register unit, i>1) in the prior art, and the structure mainly comprises a control module 20 and an output buffer module 30, wherein the control module 20 comprises inside a specific control circuit for the forward scanning and the backward scanning of the shift register unit, and the output buffer unit 30 mainly includes a pull-up TFT Tpu and a pull-down TFT Tpd, wherein gates of the pull-up TFT Tpu and the pull-down TFT Tpd are connected to a pull-up node PU and a pull-down node PD of the control module 20 respectively, and a drain of the TFT Tpu is connected to CLK2, and a source of the TFT Tpd is connected to VSS. Respective input terminals of the control module 20 are connected to a signal output terminal Vout(i−1) of the previous stage of shift register unit (i.e., the $(i-1)^{th}$ stage), CLK1, V_F and V_R, respectively. The operational process of the shift register unit (i.e., the $i^{th}$ stage of shift register unit) is as follows: when the control signal line V_F for forward scanning outputs a high level signal and the signal output terminal Vout(i−1) of the previous stage of shift register unit outputs a high level signal, the control module 20 charges the pull-up node PU so that the TFT Tpu is turned on, and discharges the pull-down node PD so that the TFT Tpd is turned off; when the CLK2 is at a high level, the CLK2 at the high level is output from the signal output terminal Vouti of the shift register unit (i.e., the $i^{th}$ stage of shift register unit) via the TFT Tpu; when the CLK2 is at a low level, the control module 20 discharges the pull-up node PU and charges the pull-down node PD so that the TFT Tpu is turned off and the TFT Tpd is turned on, and a signal at the low level VSS is output from the signal output terminal Vouti via the TFT Tpd.

The follow problem generally occurs in the specific design of the bidirectional scanning shift register unit: the gate of the pull-down TFT Tpd might be subjected to an over-bias so that the threshold voltage of the TFT Tpd varies, thus resulting in decrease of the stability of the shift register unit. Detail is as follows: as shown in FIG. 2, in order to output the signal at the low level VSS from the signal output terminal Vouti at the subsequent timings, it is required that the control module 20 charges the pull-down node PD to turn on the TFT pd when the CLK2 is in a high level state, so that the signal at the low level VSS is output from the signal output terminal Vouti via the TFT Tpd, and it is required that the potential of the pull-down node PD is maintained by the control module 20 when the CLK2 is in a low level state; therefore, the gate of the TFT Tpd is always in a high level state, the gate of the pull-down TFT Tpd might be subjected to an over-bias so that the threshold voltage of the TFT Tpd varies, which generates a great effect on the stability of the shift register unit. Besides the liquid crystal display panel, in the shift register unit and the gate driving circuit of other types of display panels adopting an array display substrate, the above problem also exists.

SUMMARY

The technical problem to be solved by embodiments of the present disclosure is to provide a shift register unit, a gate driving circuit and a display device for reducing the gate over-bias of the pull-down TFT effectively.

In order to solve the above problem, in an embodiment of the present disclosure, there is provided a shift register unit comprising: a pull-up module connected to a clock signal line and a signal output terminal; at least two pull-down modules both connected to a low level signal line and the signal output terminal; a control module connected to the pull-up module and the pull-down modules, for controlling the pull-up module to be turned on, so that a high level signal input from the clock signal line is output to the signal output terminal, and for controlling the at least two pull-down modules to be turned on alternatively, so that a low level signal input from the low level signal line is output to the signal output terminal, and for controlling one of the at least two pull-down modules to be turned on while controlling the other pull-down module of the at least two pull-down modules to be discharged.

Optionally, the at least two pull-down modules comprise a first TFT and a second TFT, wherein drains of the first TFT and the second TFT are both connected to the signal output terminal, sources thereof are both connected to the low level signal line, a gate of the first TFT is connected to a first signal line, and a gate of the second TFT is connected to a second signal line, and a signal input from the first signal line and a signal input from the second signal line are level signals with inverted amplitudes.

Optionally, the control module comprises a third TFT and a fourth TFT, wherein a gate of the third TFT is connected to the gate of the first TFT, a drain of the third TFT is connected to the gate of the second TFT, and a source of the third TFT is connected to the low level signal line; a gate of the fourth TFT is connected to the gate of the second TFT, a drain of the fourth TFT is connected to the gate of the first TFT, and a source of the fourth TFT is connected to the low level signal line.

Optionally, the control module further comprises a scan control sub-module, and the pull-up module comprises a fifth TFT and a capacitor, wherein a gate of the fifth TFT is connected to the scan control sub-module, a drain of the fifth TFT is connected to the clock signal line, and a source of the fifth TFT is connected to the signal output terminal; one terminal of the capacitor is connected to the gate of the fifth TFT, and the other terminal of the capacitor is connected to the drains of the first TFT and the second TFT.

Optionally, the control module comprises a sixth TFT, wherein a gate of the sixth TFT is connected to the gate of the first TFT, a drain of the sixth TFT is connected to the gate of the fifth TFT, and a source of the sixth TFT is connected to the low level signal line.

Optionally, the control module further comprises a seventh TFT, wherein a gate of the seventh TFT is connected to the gate of the second TFT, a drain of the seventh TFT is connected to the gate of the fifth TFT, and a source of the seventh TFT is connected to the low level signal line.

In an embodiment of the present disclosure, there is further provided a gate driving circuit comprising a plurality of shift register units described as above connected in cascade.

Optionally, in a case where the shift register unit is an odd-numbered stage of shift register unit, the gate of the first TFT therein is connected to the gate of the second TFT in a next stage of shift register unit, the gate of the second TFT therein is connected to the gate of the first TFT in the next stage of shift register unit; in a case where the shift register unit is an even-numbered stage of shift register unit, the gate of the first TFT therein is connected to the gate of the second TFT in a previous stage of shift register unit, the gate of the second TFT therein is connected to the gate of the first TFT in the previous stage of shift register unit; the gate of the first TFT in the odd-numbered stage of shift register unit is connected to the first signal line, and the gate of the first TFT in the even-numbered stage of shift register unit is connected to the second signal line.

Optionally, the control module further comprises a tenth TFT, an eleventh TFT and a twelfth TFT; in a case where the shift register unit is an odd-numbered stage of shift register unit, a gate and a drain of the tenth TFT are both connected to the first signal line, a source of the tenth TFT is connected to a drain of the twelfth TFT; a gate of the twelfth TFT is connected to a signal output terminal of a previous odd-numbered stage of shift register unit, and a source of the twelfth TFT is connected to the low level signal line; a gate of the eleventh TFT is connected to the drain of the twelfth TFT, a drain of the eleventh TFT is connected to the first signal line, and a source of the eleventh TFT is connected to the gate of the first TFT; in a case where the shift register unit is an even-numbered stage of shift register unit, a gate and a drain of the tenth TFT are both connected to the second signal line, a source of the tenth TFT is connected to a drain of the twelfth TFT; a gate of the twelfth TFT is connected to a signal output terminal of a previous even-numbered stage of shift register unit, and a source of the twelfth TFT is connected to the low level signal line; a gate of the eleventh TFT is connected to the drain of the twelfth TFT, a drain of the eleventh TFT is connected to the second signal line, and a source of the eleventh TFT is connected to the gate of the second TFT.

Optionally, the scan control sub-module comprises an eighth TFT and a ninth TFT; in the case where the shift register unit is an odd-numbered stage of shift register unit, a gate of the eighth TFT is connected to a signal output terminal of a previous odd-numbered stage of shift register unit, a drain of the eighth TFT is connected to a forward scan control signal line, and a source of the eighth TFT is connected to the gate of the fifth TFT, a gate of the ninth TFT is connected to a signal output terminal of a next odd-numbered stage of shift register unit, a drain of the ninth TFT is connected to a backward scan control signal line, and a source of the ninth TFT is connected to the gate of the fifth TFT; in the case where the shift register unit is an even-numbered stage of shift register unit, a gate of the eighth TFT is connected to a signal output terminal of a previous even-numbered stage of shift register unit, a drain of the eighth TFT is connected to the forward scan control signal line, and a source of the eighth TFT is connected to the gate of the fifth TFT, a gate of the ninth TFT is connected to a signal output terminal of a next even-numbered stage of shift register unit, a drain of the ninth TFT is connected to the backward scan control signal line, and a source of the ninth TFT is connected to the gate of the fifth TFT.

Optionally, the shift register unit further comprises a thirteenth TFT and a fourteenth TFT; in the case where the shift register unit is an odd-numbered stage of shift register unit, gates of the thirteenth TFT and the fourteenth TFT are both connected to the gate of the fifth TFT in a previous stage of shift register unit, and sources of the thirteenth TFT and the fourteenth TFT are both connected to the low level signal line, a drain of the thirteenth TFT is connected to the gate of the first TFT in the present stage of shift register unit, a drain of the fourteenth TFT is connected to the gate of the second TFT in the present stage of shift register unit, and the gate of the fifth TFT in the present stage of shift register unit is connected to the gates of the thirteenth TFT and the fourteenth TFT in a previous stage of shift register unit; in the case where the shift register unit is an even-numbered stage of shift register unit, gates of the thirteenth TFT and the fourteenth TFT are both connected to the gate of the fifth TFT in a next stage of shift register unit, and sources of the thirteenth TFT and the fourteenth TFT are both connected to the low level signal line, a drain of the thirteenth TFT is connected to the gate of the first TFT in the present stage of shift register unit, a drain of the fourteenth TFT is connected to the gate of the second TFT in the present stage of shift register unit, and the gate of the fifth TFT in the present stage of shift register unit is connected to the gates of the thirteenth TFT and the fourteenth TFT in a next stage of shift register unit.

Optionally, the gate driving circuit comprises four clock signal lines, wherein the four clock signal lines are connected sequentially to four adjacent shift register units described as above.

In an embodiment of the present disclosure, there is further provided a display device comprising the gate driving circuit as described above.

The solutions of the embodiments of the present disclosure have the following beneficial effects: the shift register unit in the gate driving circuit, at subsequent discharging timings, can control the at least two pull-down modules to be turned on alternatively, and when it controls one of the at least two pull-down modules to be turned on, it can also discharge the other pull-down module, so as to reduce the gate over-bias of the pull-down TFT, thus improving the stability of the shift register unit.

DETAILED DESCRIPTION

Detailed descriptions will be further made to particular implementations of the present disclosure in connection with accompanying drawings and embodiments of the present disclosure.

First Embodiment

Figure 3:
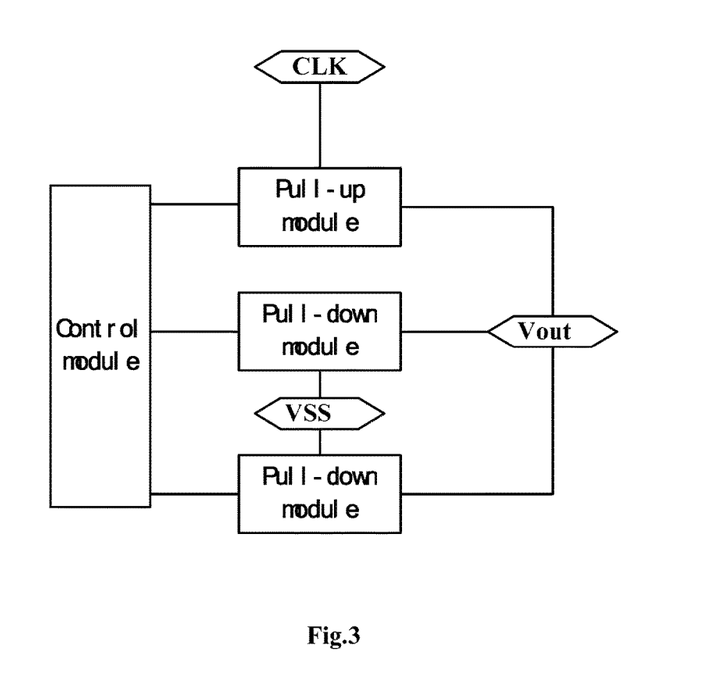
FIG. 3 is a schematic structure diagram of a shift register unit according to a first embodiment of the present disclosure.

FIG. 3 shows a schematic structure diagram of a shift register unit according to the first embodiment of the present disclosure, and the shift register unit comprises: a pull-up module, two pull-down modules and a control module.

The pull-up module is connected to a clock signal line CLK, a signal output terminal Vout and the control module, and is turned on under the control of the control module to output a high level signal input from the clock signal line CLK to the signal output terminal Vout.

The two pull-down modules are both connected to a low level signal line VSS, the signal output terminal Vout and the control module, and are turned on alternatively under the control of the control module to output a low level signal input from the low level signal line VSS to the signal output terminal Vout, wherein when one pull-down module is turned on, the other pull-down module is discharged.

The control module is connected to the pull-up module and the two pull-down modules; and is used for controlling the pull-up module to be turned on, so that the pull-up module outputs the high level signal input from the clock signal line to the signal output terminal, and is used for controlling the two pull-down modules to be turned on alternatively, so that the two pull-down modules output the low level signal input from the low level signal line to the signal output terminal, and the control module controls one of the two pull-down modules to be turned on while controlling the other pull-down module to be discharged.

The shift register unit provided in the above embodiment, at discharging timings, can control the two pull-down modules to be turned on alternatively, and when it controls one of the two pull-down modules to be turned on, it can discharge the other pull-down module, so as to prevent each of the pull-down modules from being subjected to over-bias, thus improving the stability of the shift register unit.

In the above embodiment, a case where the shift register unit comprises two pull-down modules is taken as an example for illustration, and in other embodiments of the present disclosure, the shift register unit may comprise more than two pull-down modules, wherein the pull-down modules are turned on alternatively, and when one of the pull-down modules is turned on, the other pull-down modules are all discharged, and the circuit connection relationship thereof is similar to that in the first embodiment, and the detail is omitted.

The pull-down module in the embodiment of the present disclosure can be implemented by TFTs. Naturally, it can also be implemented in other ways, as long as the low level signal input from the low level signal line VSS can be output to the signal output terminal Vout, and in the following embodiments, a case where the pull-down modules are implemented by TFTs is taken as an example.

Second Embodiment

Figure 4:
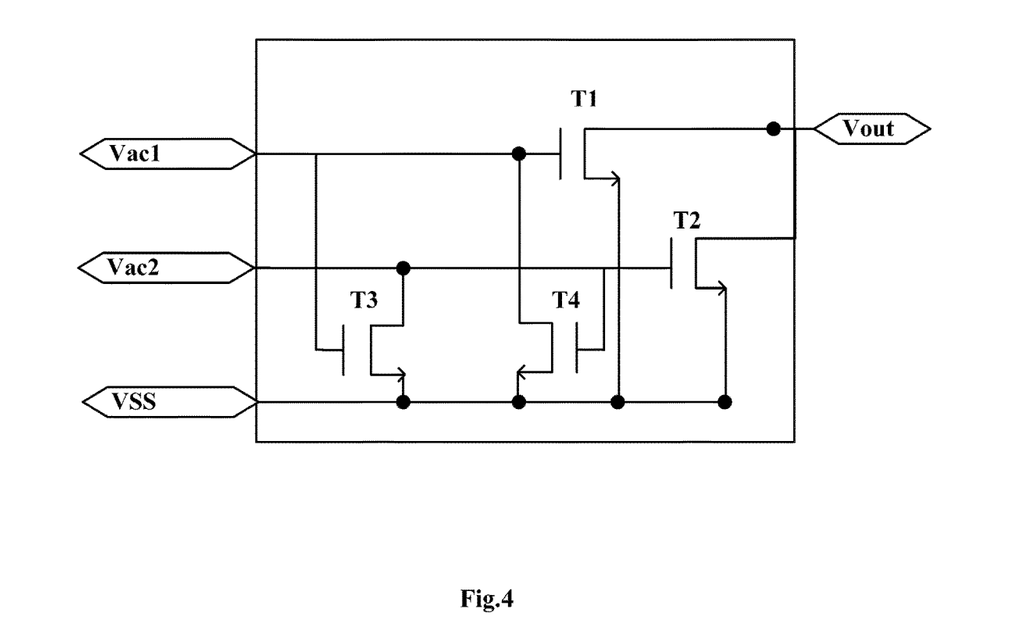
FIG. 4 is a schematic structure diagram of a shift register unit according to a second embodiment of the present disclosure.

The shift register unit in the second embodiment of the present disclosure comprises a pull-up module, two pull-down modules and a control module, wherein as shown in FIG. 4, the two pull-down modules are a first TFT T1 and a second TFT T2 respectively, drains of the first TFT T1 and the second TFT T2 are both connected to the signal output terminal Vout, sources thereof are both connected to the low level signal line VSS, a gate of the first TFT T1 is connected to a first signal line Vac1, and a gate of the second TFT T2 is connected to a second signal line Vac2. A signal input from the first signal line Vac1 and a signal input from the second signal line Vac2 are level signals with inverted amplitudes.

The first TFT T1 and the second TFT T2 can be turned on alternatively. In particular, presuming that during a first period, a signal input from the first signal line Vac1 is a high level signal, a signal input from the second signal line Vac2 is a low level signal, then the first TFT T1 is turned on and the second TFT T2 is turned off; during a second period, the signal input from the second signal line Vac2 changes to be a high level signal, and the signal input from the first signal line Vac1 changes to be a low level signal, then the second TFT T2 is turned on and the first TFT T1 is turned off.

Further, in order to ensure the gates of the first TFT and the second TFT not being subjected to over-bias, it is also possible to discharge one TFT when the other TFT is turned on. In this case, the control module in the embodiment of the present disclosure further comprises a third TFT T3 and a fourth TFT T4, wherein a gate of the third TFT T3 is connected to the gate of the first TFT T1, a drain of the third TFT T3 is connected to the gate of the second TFT T2, and a source of the third TFT T3 is connected to the low level signal line VSS; a gate of the fourth TFT T4 is connected to the gate of the second TFT T2, a drain of the fourth TFT T4 is connected to the gate of the first TFT T1, and a source of the fourth TFT T4 is connected to the low level signal line VSS.

By means of the above structure, when the gate of the first TFT T1 is at a high level, the third TFT T3 is turned on, so that the gate of the second TFT T2 is discharged; when the gate of the second TFT T2 is at a high level, the fourth TFT T4 is turned on, so that the gate of the first TFT T1 is discharged.

In the above embodiment, the two pull-down modules can be turned on alternatively, and when one of the two pull-down modules is turned on, the other is discharged; further, when any one of the two pull-down modules is turned on, the pull-up module is discharged.

In particular, the control module can further comprise a scan control sub-module, and the pull-up module comprises a fifth TFT and a capacitor, wherein a gate of the fifth TFT is connected to the scan control sub-module, a drain of the fifth TFT is connected to the clock signal line, and a source of the fifth TFT is connected to the signal output terminal; one terminal of the capacitor is connected to the gate of the fifth TFT, and the other terminal of the capacitor is connected to the drains of the first TFT T1 and the second TFT T2.

When the gate of the first TFT T1 (as an alternative, of the second TFT T2) is at a high level, the first TFT T1 (as an alternative, the second TFT T2) is turned on, and a low level signal input from the low level signal line is input to the gate of the fifth TFT, so that the gate of the fifth TFT is discharged, and thus the electric charges accumulated at the gate of the fifth TFT can be released effectively, further improving the stability of the shift register unit.

To further improve the discharging effect of the pull-up module, the control module of the embodiment of the present disclosure can further comprise a sixth TFT and a seventh TFT, wherein a gate of the sixth TFT is connected to the gate of the first TFT T1, a drain of the sixth TFT is connected to the gate of the fifth TFT, and a source of the sixth TFT is connected to the low level signal line; a gate of the seventh TFT is connected to the gate of the second TFT T2, a drain of the seventh TFT is connected to the gate of the fifth TFT, and a source of the seventh TFT is connected to the low level signal line. In particular, when the gate of the first TFT T1 is at a high level, the gate of the fifth TFT can be discharged via the sixth TFT, and when the gate of the second TFT T2 is at a high level, the gate of the fifth TFT can be discharged via the seventh TFT.

Third Embodiment

In the embodiment of the present disclosure, there is further provided a gate driving circuit comprising a plurality of shift register units connected in cascade, wherein each of the shift register units comprises: a pull-up module, two pull-down modules and a control module.

The pull-up module is connected to a clock signal line, a signal output terminal and a control module, and is turned on under the control of the control module to output a high level signal input from the clock signal line to the signal output terminal;

The two pull-down modules are both connected to a low level signal line, the signal output terminal and the control module, and are turned on alternatively under the control of the control module to output a low level signal input from the low level signal line to the signal output terminal, wherein when one pull-down module is turned on, the other pull-down module is discharged.

The control module is connected to the pull-up module and the two pull-down modules; and is used for controlling the pull-up module to be turned on, so that the pull-up module outputs the high level signal input from the clock signal line to the signal output terminal; and is used for controlling the two pull-down modules to be turned on alternatively, so that the two pull-down modules output the low level signal input from the low level signal line to the signal output terminal, and the control module controls one of the two pull-down modules to be turned on while controlling the other pull-down module to be discharged.

The shift register unit, at discharging timings, can control the two pull-down modules to be turned on alternatively, and when it controls one of the two pull-down modules to be turned on, it can discharge the other pull-down module, so as to prevent each of the pull-down modules from being subjected to over-bias, thus improving the stability of the shift register unit.

In the above embodiment, a case where the shift register unit comprises two pull-down modules is taken as an example for illustration, and in other embodiments of the present disclosure, the shift register unit may comprise more than two pull-down modules, wherein the pull-down modules are turned on alternatively, and when one of the pull-down modules is turned on, the other pull-down modules are all discharged, and the circuit connection relationship thereof is similar to that in the first embodiment, and the detail is omitted.

The pull-down module in the embodiment of the present disclosure can be implemented by TFTs. Naturally, it can also be implemented in other ways, as long as the low level signal input from the low level signal line VSS can be output to the signal output terminal Vout, and in the following embodiments, a case where the pull-down modules are implemented by TFTs is taken as an example.

Fourth Embodiment

A gate driving circuit according to the fourth embodiment of the present disclosure comprises a plurality of shift register units connected in cascade, wherein each of the shift register units comprises: a pull-up module, two pull-down modules and a control module, wherein the two pull-down modules are a first TFT and a second TFT respectively, drains of the first TFT and the second TFT are both connected to the signal output terminal, sources thereof are both connected to the low level signal line; in a case where the shift register unit is an odd-numbered stage of shift register unit, a gate of a first TFT therein is connected to a gate of a second TFT in a next stage of shift register unit, a gate of a second TFT therein is connected to a gate of a first TFT in the next stage of shift register unit; in a case where the shift register unit is an even-numbered stage of shift register unit, a gate of a first TFT therein is connected to a gate of a second TFT in a previous stage of shift register unit, a gate of a second TFT therein is connected to a gate of a first TFT in the previous stage of shift register unit; the gate of the first TFT in the odd-numbered stage of shift register unit is connected to the first signal line, and the gate of the first TFT in the even-numbered stage of shift register unit is connected to the second signal line, and the signal input from the first signal line and that input from the second signal line are level signals with inverted amplitudes.

The first TFT and the second TFT can be turned on alternatively. In particular, presuming that during a first period, a signal input from the first signal line is a high level signal, a signal input from the second signal line is a low level signal, then the first TFT is turned on and the second TFT is turned off; during a second period, the signal input from the second signal line changes to be a high level signal, and the signal input from the first signal line changes to be a low level signal, then the second TFT is turned on and the first TFT is turned off.

In the above shift register unit, the first TFT and the second TFT can be turned on alternatively in various modes, and the detailed description will be given hereinafter by means of examples.

The control module can further comprise a tenth TFT, an eleventh TFT and a twelfth TFT; in a case where the shift register unit is an odd-numbered stage of shift register unit, a gate and a drain of the tenth TFT are both connected to the first signal line, a source of the tenth TFT is connected to a drain of the twelfth TFT; a gate of the twelfth TFT is connected to a signal output terminal of a previous odd-numbered stage of shift register unit, and a source of the twelfth TFT is connected to the low level signal line; a gate of the eleventh TFT is connected to the drain of the twelfth TFT, a drain of the eleventh TFT is connected to the first signal line, and a source of the eleventh TFT is connected to the gate of the first TFT; in a case where the shift register unit is an even-numbered stage of shift register unit, a gate and a drain of the tenth TFT are both connected to the second signal line, a source of the tenth TFT is connected to a drain of the twelfth TFT; a gate of the twelfth TFT is connected to a signal output terminal of a previous even-numbered stage of shift register unit, and a source of the twelfth TFT is connected to the low level signal line; a gate of the eleventh TFT is connected to the drain of the twelfth TFT, a drain of the eleventh TFT is connected to the second signal line, and a source of the eleventh TFT is connected to the gate of the second TFT Further, in order to ensure the gates of the first TFT and the second TFT not being subjected to over-bias, it is also possible to discharge one TFT when the other TFT is turned on. The control module in the embodiment of the present disclosure further comprises a third TFT and a fourth TFT, wherein a gate of the third TFT is connected to the gate of the first TFT, a drain of the third TFT is connected to the gate of the second TFT, and a source of the third TFT is connected to the low level signal line; a gate of the fourth TFT is connected to the gate of the second TFT, a drain of the fourth TFT is connected to the gate of the first TFT, and a source of the fourth TFT is connected to the low level signal line.

By means of the above structure, when the gate of the first TFT is at a high level, the third TFT is turned on, so that the gate of the second TFT is discharged; when the gate of the second TFT is at a high level, the fourth TFT is turned on, so that the gate of the first TFT is discharged.

In the above embodiment, the two pull-down modules can be turned on alternatively, and when one of the two pull-down modules is turned on, the other is discharged; further, when any one of the two pull-down modules is turned on, the pull-up module is discharged.

In particular, the control module can further comprise a scan control sub-module, and the pull-up module comprises a fifth TFT and a capacitor, wherein a gate of the fifth TFT is connected to the scan control sub-module, a drain of the fifth TFT is connected to the clock signal line, and a source of the fifth TFT is connected to the signal output terminal; one terminal of the capacitor is connected to the gate of the fifth TFT, and the other terminal of the capacitor is connected to the drains of the first TFT and the second TFT.

When the gate of the first TFT (as an alternative, of the second TFT) is at a high level, the first TFT (as an alternative, the second TFT) is turned on, and a low level signal input from the low level signal line is input to the gate of the fifth TFT, so that the gate of the fifth TFT is discharged, and thus the electric charges accumulated at the gate of the fifth TFT can be released effectively, further improving the stability of the shift register unit.

The shift register unit in the embodiment of the present disclosure can be a bidirectional scanning shift register unit, and in order to realize the bidirectional scanning, the scan control sub-module can comprise an eighth TFT and a ninth TFT; in the case where the shift register unit is an odd-numbered stage of shift register unit, a gate of the eighth TFT is connected to a signal output terminal of a previous odd-numbered stage of shift register unit, a drain of the eighth TFT is connected to a forward scan control signal line, and a source of the eighth TFT is connected to the gate of the fifth TFT, a gate of the ninth TFT is connected to a signal output terminal of a next odd-numbered stage of shift register unit, a drain of the ninth TFT is connected to a backward scan control signal line, and a source of the ninth TFT is connected to the gate of the fifth TFT; in the case where the shift register unit is an even-numbered stage of shift register unit, a gate of the eighth TFT is connected to a signal output terminal of a previous even-numbered stage of shift register unit, a drain of the eighth TFT is connected to the forward scan control signal line, and a source of the eighth TFT is connected to the gate of the fifth TFT, a gate of the ninth TFT is connected to a signal output terminal of a next even-numbered stage of shift register unit, the drain of the ninth TFT is connected to the backward scan control signal line, and the source of the ninth TFT is connected to the gate of the fifth TFT.

To further improve the discharging effect of the pull-up module, the control module of the present disclosure can further comprise a sixth TFT and a seventh TFT, wherein a gate of the sixth TFT is connected to the gate of the first TFT, a drain of the sixth TFT is connected to the gate of the fifth TFT, and a source of the sixth TFT is connected to the low level signal line; a gate of the seventh TFT is connected to the gate of the second TFT, a drain of the seventh TFT is connected to the gate of the fifth TFT, and a source of the seventh TFT is connected to the low level signal line. In particular, when the gate of the first TFT is at a high level, the gate of the fifth TFT can be discharged via the sixth TFT, and when the gate of the second TFT is at a high level, the gate of the fifth TFT can be discharged via the seventh TFT.

In order to improve the operation efficiency of the gate driving circuit, different stages of shift register units can be coupled to each other. In particular, the shift register unit can further comprise a thirteenth TFT and a fourteenth TFT; in the case where the shift register unit is an odd-numbered stage of shift register unit, gates of the thirteenth TFT and the fourteenth TFT are both connected to the gate of the fifth TFT in a previous stage of shift register unit, and sources of the thirteenth TFT and the fourteenth TFT are both connected to the low level signal line, the drain of the thirteenth TFT is connected to the gate of the first TFT in the present stage of shift register unit, the drain of the fourteenth TFT is connected to the gate of the second TFT in the present stage of shift register unit, and the gate of the fifth TFT in the present stage of shift register unit is connected to the gates of the thirteenth TFT and the fourteenth TFT in a previous stage of shift register unit; in the case where the shift register unit is an even-numbered stage of shift register unit, the gates of the thirteenth TFT and the fourteenth TFT are both connected to the gate of the fifth TFT in a next stage of shift register unit, and sources of the thirteenth TFT and the fourteenth TFT are both connected to the low level signal line, the drain of the thirteenth TFT is connected to the gate of the first TFT in the present stage of shift register unit, the drain of the fourteenth TFT is connected to the gate of the second TFT in the present stage of shift register unit, and the gate of the fifth TFT in the present stage of shift register unit is connected to the gates of the thirteenth TFT and the fourteenth TFT in a next stage of shift register unit.

To decrease an occurrence frequency of pulses so as to reduce the power consumption of the gate driving circuit, the gate driving circuit can comprise four clock signal lines, wherein the four clock signal lines are connected sequentially to four adjacent shift register units.

Fifth Embodiment

Figure 5:
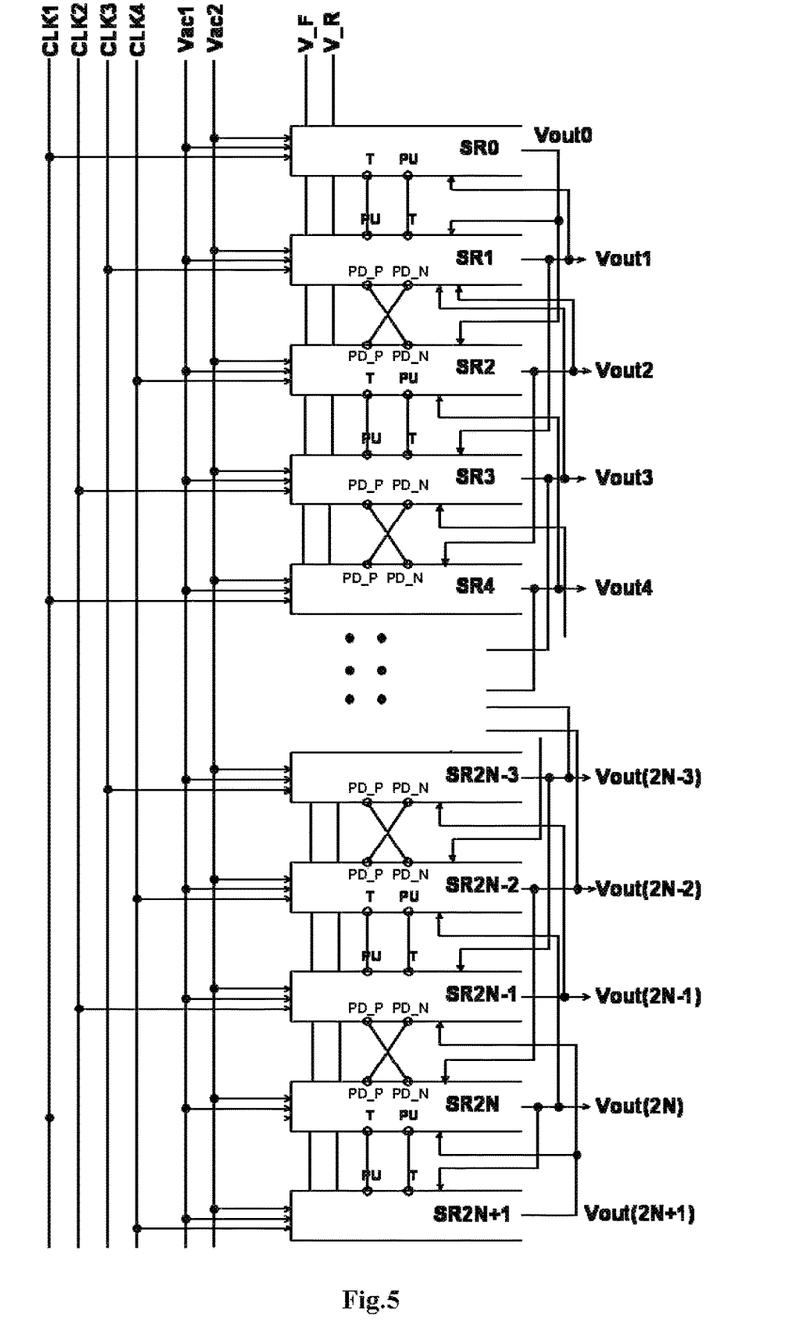
FIG. 5 is a schematic structure diagram of a gate driving circuit according to a fifth embodiment of the present disclosure.

FIG. 5 is a schematic structure diagram of a gate driving circuit according to a fifth embodiment of the present disclosure. Compared to the gate driving circuit in the prior art shown in FIG. 1, the gate driving circuit in the present embodiment of the present disclosure adopts four clock control signal lines CLK1-CLK4, increase of the clock control signal lines is to decrease the occurrence frequency of pulses, to achieve the purpose of reducing the power consumption of the gate driving circuit. In addition, two signal control lines Vac1 and Vac2 are added, for realizing the process in which the pull-down units in the shift register unit are discharged alternatively during different time periods (for example, two adjacent frame periods) in the subsequent discharging timings. V_F and V_R are control signal lines for controlling a forward scanning and a backward scanning. Further, compared to the gate driving circuit in the prior art shown in FIG. 1, a top dummy stage of shift register unit SR0 and a bottom dummy stage of shift register unit SR2N+1 are added, and the design of dummy stages is to prevent an external error signal from being input to SR1 or SR2N during the forward scanning or the backward scanning. On the other hand, in the connection of the different stages of shift register units, from top to bottom, the couples between odd-numbered stages and even-numbered stages are added; that is, pull-down nodes PD_P and PD_N in an odd-numbered stage are connected to pull-down nodes PD_N and PD_P in an even-numbered stage respectively, for example, PD_P and PD_N in SR1 are connected to PD_N and PD_P in SR2 respectively, PD_P and PD_N in SR3 are connected to PD_N and PD_P in SR4 respectively. In addition, in order to improve the discharging effect, nodes T and PU are connected to nodes PU and T in a previous stage or in a next stage respectively, for example, T and PU in SR0 are connected to PU and T in SR1 respectively, and T and PU in SR2 are connected to PU and T in SR3 respectively.

Figure 6:
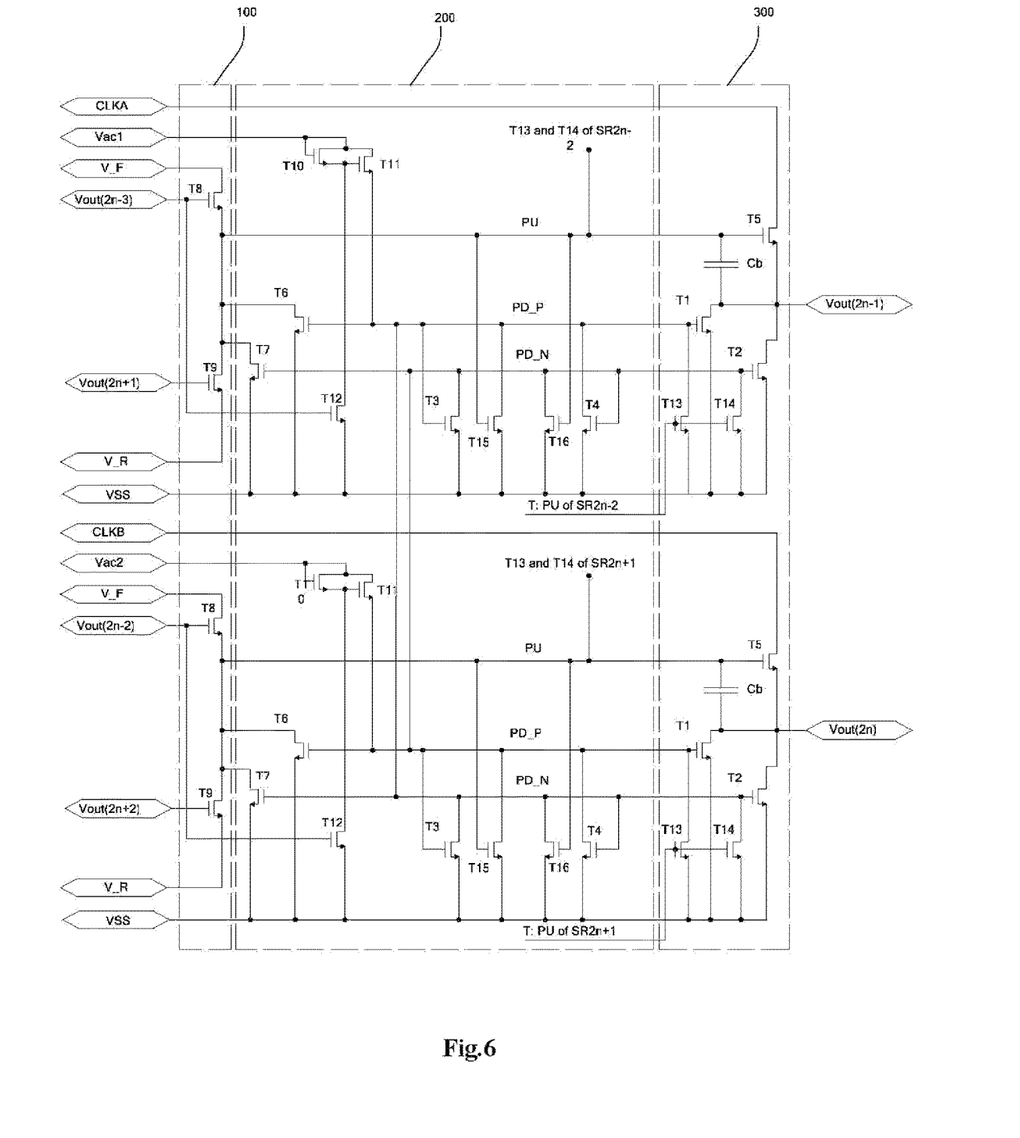
FIG. 6 is a schematic structure diagram of a shift register unit according to the fifth embodiment of the present disclosure.

FIG. 6 is a schematic diagram of a circuit structure of shift register unit according to the fifth embodiment of the present disclosure, and in FIG. 6, a circuit structure of an odd-numbered stage of shift register unit and an adjacent even-numbered stage of shift register unit is included.

The circuit structure of the odd-numbered stage of shift register unit comprises a first control module 100, a second control module 200 and a output buffer module 300, wherein the first control module 100 and the second control module 200 perform the functions of the control module in the above embodiment, and the output buffer module 300 performs the functions of the pull-up module and the pull-down modules in the above embodiment.

The first control module 100 comprises TFT T8 and TFT T9, wherein drains of T8 and T9 are connected to the scan control signal lines V_F and V_R respectively, gates of T8 and T9 are connected to an output terminal Vout($2n-3$) of a previous odd-numbered stage of shift register unit and an output terminal Vout($2n+1$) of a next odd-numbered stage of shift register unit respectively.

The second control module 200 comprises TFTs T3, T4, T6, T7, T10, T11, T12, T15, and T16, wherein drains of T6 and T7 are both connected to the pull-up node PU, gates of T6 and T7 are connected to the pull-down nodes PD_P and PD_N respectively, and sources of T6 and T7 are both connected to the low level signal line VSS. A drain of T11 and a gate and drain of T10 are connected to the first signal line Vac1, a source of T10 is connected to a gate of T11 and a drain of T12. A source of T11 is connected to the pull-down node PD_P, a gate and source of T12 are connected to the output terminal Vout($2n-3$) of the previous odd-numbered stage of shift register unit and the low level signal line VSS respectively. T12 functions as follows: when Vout($2n-3$) is at a high level, T12 enables the gate of T11 to be discharged to the low level VSS, so that the Vac1 at a high level can not be output to the node PD_P via T10 and T11; when Vout ($2n-3$) is at a low level, T12 is turned off, and the Vac1 at the high level can be output to the node PD_P via T10 and T11. A gate of T3 and that of T4 are connected to the pull-down nodes PD_P and PD_N respectively, a drain of T3 and that of T4 are connected to the pull-down nodes PD_N and PD_P respectively, and the sources of T3 and T4 are both connected to VSS. T3 (or T4) functions to enable the node PD_N (or PD_P) to be discharge when PD_P (or PD_N) is at a high level. A gate of T15 and that of T16 are both connected to the pull-up node PU, a drain of T15 and that of T16 are connected to the pull-down nodes PD_P and PD_N respectively, and sources of T15 and T16 are both connected to VSS. T15 and T16 function to enable the nodes PD_P and PD_N to be discharged to the low level VSS respectively. Further, the pull-up node PU is connected to gates of T13 and T14 in a previous stage of shift register unit SR$2n-2$, and functions to enable the pull-down nodes PD_P and PD_N in the previous stage of shift register unit SR$2n-2$ to be discharged to the low level VSS when the node PU is at a high level.

The output buffer module 300 comprises TFTs T1, T2, T13, T14, and T5 and a capacitor Cb. When the pull-up node PU is at a high level, the CLKA at a high level is output via T5; gates of T1 and T2 are connected to the nodes PD_P and PD_N respectively, and T1 and T2 mainly function to pull down the signal output terminal to the low level VSS when the node PD_P or PD_N is at a high level; gates of T13 and T14 are both connected to the pull-up node PU in the shift register unit SR2N-2, drains of T13 and T14 are connected to the nodes PD_P and PD_N respectively, and sources of T13 and T14 are both connected to VSS. The functions of T13 and T14 function to discharge the pull-down nodes PD_P and PD_N in the shift register unit SR$2n-1$ to the low level VSS, respectively, when the pull-up node PU in the shift register unit SR$2n-2$ is at a high level.

The even-numbered stage of shift register unit also comprises a first control module 100, a second control module 200 and an output buffer module 300. The circuit of the even-numbered stage of shift register unit is similar to that of the odd-numbered stage of shift register unit as a whole, except that gates of T8 and T9 in the even-numbered stage of shift register unit are connected to an output terminal Vout(2n−2) of a previous even-numbered stage of shift register unit and an output terminal Vout(2n+2) of a next even-numbered stage of shift register unit, respectively, and that a gate of T10 is connected to the second signal line Vac2. Further, the pull-down nodes PD_P and PD_N in an odd-numbered stage of shift register unit are connected to the pull-down nodes PD_N and PD_P in an even-numbered stage of shift register unit; gates of T13 and T14 in an even-numbered stage of shift register unit (i.e., SR2n) are both connected to the pull-up node PU in a next stage of shift register unit (i.e., SR2n+1), and the pull-up node PU in the even-numbered stage of shift register unit is connected to gates of T13 and T14 in the shift register unit SR2n+1.

Figure 7:
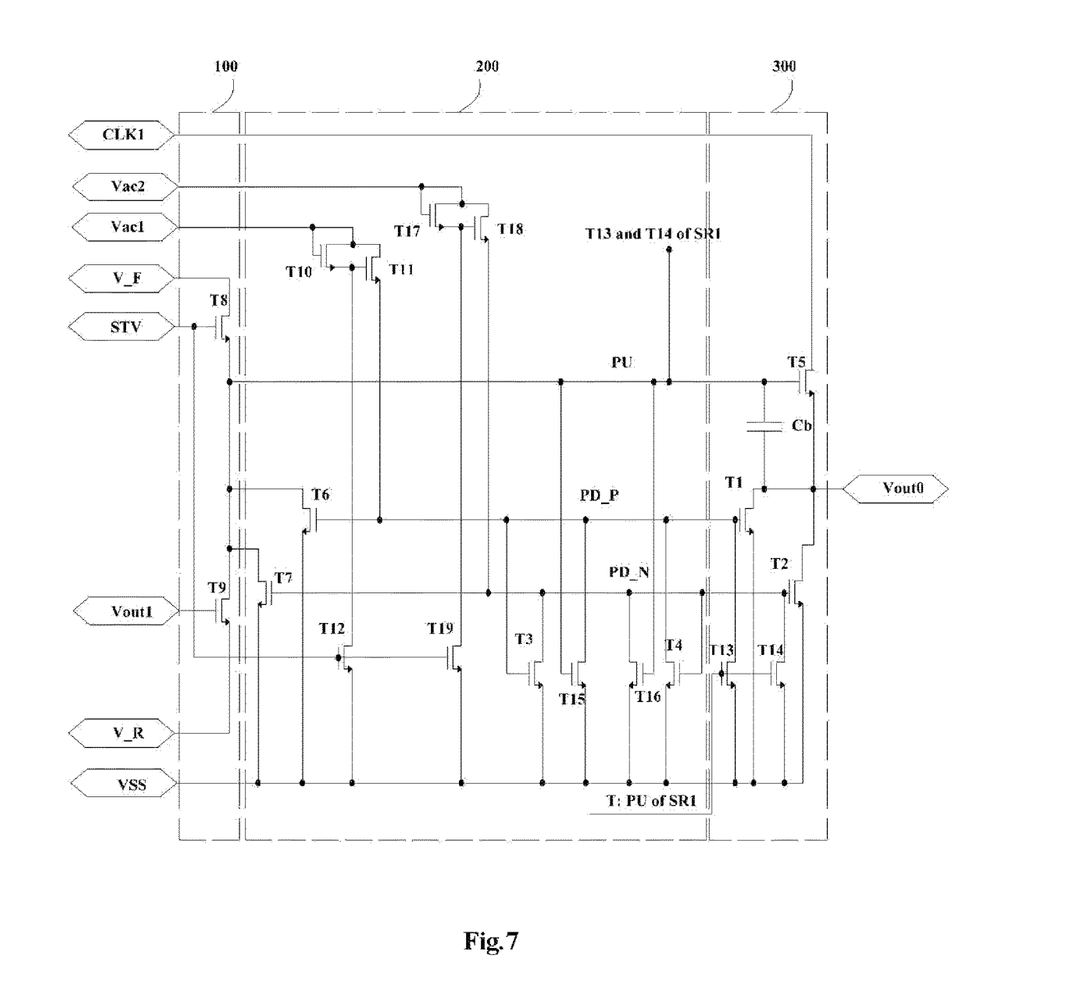
FIG. 7 is a schematic structure diagram of a SR0 stage of shift register unit according to the fifth embodiment of the present disclosure.

FIG. 7 shows a circuit structure of a dummy stage of shift register unit SR0. Compared to the circuit structure of the odd-numbered stage of shift register unit or the even-numbered stage of shift register unit shown in FIG. 6, an additional set of TFTs T17, T18 and T19 for controlling nodes are incorporated, wherein a gate of T19 is connected to STV, a source of T18 is connected to the pull-down node PD_N, a drain of T18 and a gate and source of T17 are connected to Vac2. Gates of T13 and T14 in the shift register unit SR0 are both connected to the pull-up node PU in the shift register unit SR1, and the pull-up node PU in the shift register unit SR0 is connected to gates of T13, T14 in the shift register unit SR1. Through T10, T11, and T12, and T17, T18, and T19, the node PU and the signal output terminal Vout0 can be discharged alternatively when Vac1 or Vac2 is at a high level, that is, when the pull-down node PD_P or PD_N is at a high level.

Figure 8:
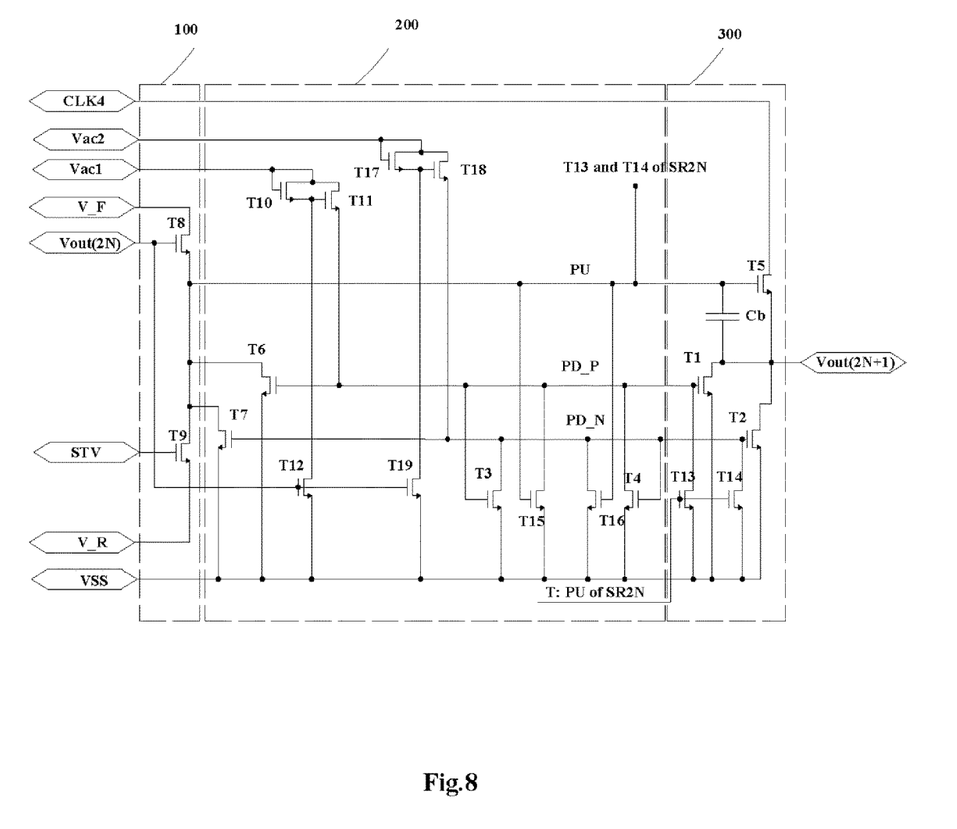
FIG. 8 is a schematic structure diagram of a SR2N+1 stage of shift register unit according to the fifth embodiment of the present disclosure.

FIG. 8 shows a circuit diagram of a dummy stage of shift register unit SR2N+1, wherein the circuit structure thereof is similar to that of the dummy stage of shift register unit SR0, except that gates of T8 and T9 are connected to the Vout(2N) and STV respectively, and that gates of T13 and T14 in the shift register unit SR2N+1 are both connected to the pull-up node PU in the shift register unit SR2N, and the pull-up node PU in the shift register unit SR2N+1 is connected to the gates of T13 and T14 in the shift register unit SR2N.

Figure 9:
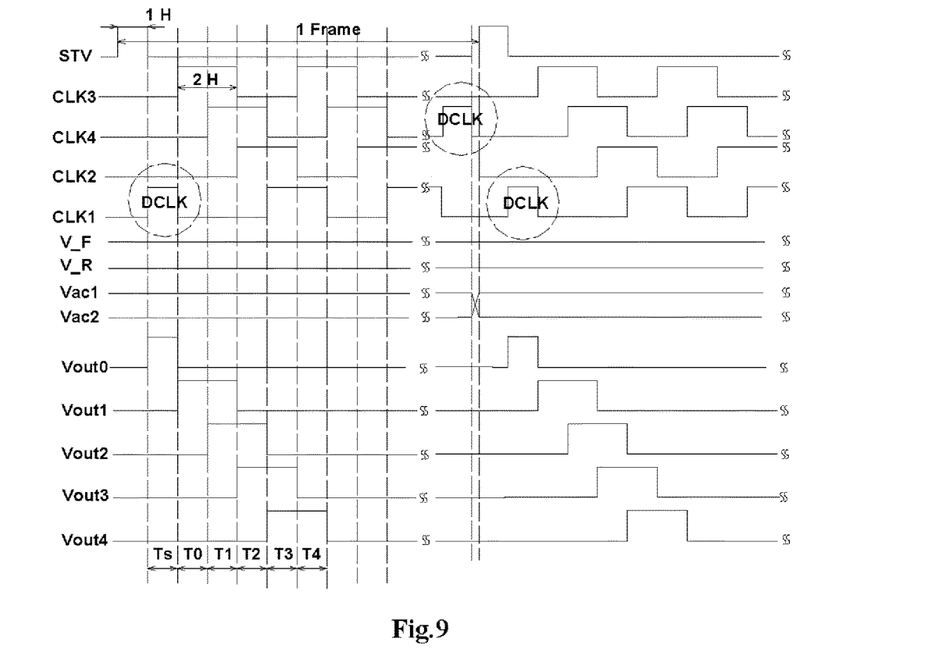
FIG. 9 is an operational timing diagram of the shift register unit according to the fifth embodiment of the present disclosure in a forward scanning.

FIG. 9 shows a timing diagram of signals of the shift register unit shown in FIGS. 6-8 in a forward scanning process. As shown in FIG. 9, there are about two frame periods illustrated in the timing diagram, wherein it is presumed that the width of the pulse of the STV signal, and the width of the pulse of the dummy DCLK superposing on CLK1 and CLK4 are both 1H, and the width of the pulses of CLK1-CLK4 is 2H. During a first frame period, it is presumed that Vac1 and Vac2 are at a high level and a low level respectively, and that V_F and V_R are at a high level and a low level respectively.

At a timing just before a period Ts, STV is at a high level, and thus T8 in the dummy stage SR0 shown in FIG. 7 is turned on, and the pull-up node PU is charged to a high level, so that T5 is turned on; meanwhile, T12 and T19 are turned on since STV is at a high level, the gates of T11 and T18 are connected to the low level signal line VSS, and thus the Vac1 at a high level can not be output to the node PD_P via T11; meanwhile, since the gates of T15 and T16 are both connected to the pull-up node PU, the pull-down nodes PD_P and PD_N are discharged to the low level VSS via T15 and T16 respectively, and thus T6, T1, T7, and T2 are all turned off. In addition, since the pull-up node PU in SR0 is connected to the gates of T13 and T14 in SR1, the pull-down nodes PD_P and PD_N in SR1 are pulled down to the low level VSS.

During a period Ts, the dummy clock DCLK superposing on CLK1 arrives and is output to Vout0 via T5, and the high level of DCLK is input to the gate of T8 in SR1 and that of T8 in SR2, so that T5 in SR1 and T5 in SR2 shown in FIG. 5 are both turned on, and the pull-up node PU in SR1 and the pull-up node PU in SR2 are both charged to a high level; meanwhile, in SR1 and SR2, since the gate of T12 is connected to Vout0, T12 is also turned on; so that the gate of T11 is connected to the low level signal line VSS, and the high level Vac1 can not be output to the pull-down node PD_P via T11; at the same time, since the gates of T15 and T16 are both connected to the pull-up node PU, the pull-down nodes PD_P and PD_N are both connected to the low level signal line VSS, and thus T6, T1, T7 and T2 are all turned off.

During a period T0, CLK3 changes to a high level, and it can be known from the above that T5 in SR1 is turned on, and the high level of CLK3 is output to Vout1 via T5; from the connection shown in FIG. 5, it can be known that the high level of CLK3 is input to the gate of T8 in SR3, so that the pull-up node PU in SR3 is charged to a high level, T5 in SR3 is turned on, and at the same time, the pull-down nodes PD_P and PD_N in SR3 change to a low level, and T6, T1, T7, and T2 are all turned off. In additional, it can be seen that from FIG. 5, the high level of Vout1 can be fed back to the gate of T9 in SR0 shown in FIG. 7, so that the pull-up node PU in SR0 can be discharged to a low level V_R; meanwhile, since the pull-up node PU in SR1 is connected to the gates of T13 and T14 in SR0, the pull-down effect for the nodes PD_P and PD_N in SR0 can be enhanced.

During a period T1, CLK4 changes to a high level, and it can be known from the above that T5 in SR2 is turned on, and the high level of CLK4 is output to Vout2 via T5; from the connection shown in FIG. 5, it can be known that the high level of CLK4 is input to the gate of T8 in SR4, so that the pull-up node PU in SR4 is charged to a high level, T5 in SR4 is turned on, the pull-down nodes PD_P and PD_N in SR4 change to a low level, and T6, T1, T7, and T2 are all turned off. Meanwhile, since the pull-up node PU in SR2 is connected to the gates of T13 and T14 in SR3, the pull-down nodes PD_P and PD_N in SR3 are discharged to a low level VSS. At the same time, Vout1 continues to output the high level of CLK3. It should be noted that, for SR0 shown in FIG. 7, since the pull-up node PU is discharged to a low level V_R, T15 and T16 are both turned off; and the high level of Vac1 can be input to the pull-down node PD_P via T10 and T11; since the gates of T13 and T14 are both connected to the pull-up node PU in SR1, the pull-down nodes PD_P and PD_N are at a low level VSS due to the powerful discharging capability of T13 and T14.

During a period T2, CLK2 changes to a high level, and it can be known from the above that T5 in SR3 is turned on, and the high level of CLK2 is output to Vout3 via T5; likewise from the connection shown in FIG. 5, it can be known that the high level of CLK2 is input to the gate of T8 in SR5, so that the pull-up node PU in SR5 is charged to a high level, T5 in SR5 is turned on, the pull-down nodes PD_P and PD_N in SR5 change to a low level, and T6, T1, T7, and T2 are all turned off. Since the node PU in SR3 is connected to the gates of T13 and T14 in SR2, the pull-down effect of T13 and T14 in SR2 can be further enhanced. It can also be known from FIG. 5 that the high level of Vout3 can be input to the gate of T9 in SR1, so that the node PU in SR1 is discharged to the low level V_R. At this time, the high level of Vac1 in SR0 can be output to the node PD_P via T11, so that T6 and T1 are turned on, Vout0 and the node PU are both discharged to the low level, T7 and T2 are both turned off. Meanwhile, Vout2 continues to output the high level of CLK4.

During a period T3, CLK1 changes to a high level, and it can be known from the above that T5 in SR4 is turned on, and the high level of CLK1 is output to Vout4 via T5; Similarly, from FIG. 5, it can be known that the high level of CLK1 is input to the gate of T8 in SR6, so that the pull-up node PU in SR6 is charged to a high level, T5 in SR6 is turned on, the pull-down nodes PD_P and PD_N in SR6 change to a low level, and T6, T1, T7, and T2 are all turned off. Meanwhile, the high level at Vout4 can be input to the gates of T13 and T14 in SR5, so that the pull-down nodes PD_P and PD_N in SR5 are pulled down to the low level VSS. Also from FIG. 5, it can be known that the high level at Vout4 can be input to the gate of T9 in SR2, so that the node PU in SR2 is discharged to the low level V_R. Similar to the above analysis, in SR1, the high level of Vac1 can be output to the pull-down node PD_P via T11, and thus T6 and T1 in SR1 are turned on, T7 and T2 in SR2 are turned on, while the pull-down node PD_N in SR1 and the pull-down node PD_P in SR2 are still at the low level VSS.

During a period prior to the end of a first frame, the dummy pulse superposing on CLK4 is output to Vout(2N+1) via the T2 in SR2N+1 shown in FIG. 8, and at the same time the high level of the dummy pulse is input to the gates of T9 in SR2N and T9 in SR2N−1, so that the nodes PU in the SR2N and SN2N−1 are discharged to the low level VSS. At this time, the high level of Vac1 in all the previous odd-numbered stages is input to the node PD_P via T11, and since the nodes PD_P and PD_N in an odd-numbered stage of shift register unit are connected to the nodes PD_N and PD_P in an adjacent even-numbered stage of shift register unit, respectively, T6 and T1 in the odd-numbered stage and T7 and T2 in the even-numbered stage are turned on, so that the corresponding node PU and each output terminal are discharged. At this time, the gates of T7 and T2 in the odd-numbered stage and the gates of T6 and T1 in the even-numbered stage are at the low level VSS.

At the beginning of a second frame, the timing diagram of the shift register unit is similar to that in the first frame, and the difference lies in that Vac2 is at a high level and Vac1 is at a low level in the second frame; then during the subsequent periods, each stage of shift register unit continues to be discharged since the high level of Vac2 is output to the node PD_P via T11 in an even-numbered stage; the nodes PD_P and PD_N in an odd-numbered stage of shift register unit are connected to the nodes PD_N and PD_P in an adjacent even-numbered stage of shift register unit respectively, T7 and T2 in the odd-numbered stage of shift register unit and T6 and T1 in the even-numbered stage of shift register unit are all turned on, so that the corresponding node PU and each output terminal are discharged, while T6 and T1 in the odd-numbered stage and T7 and T2 in the even-numbered stage are all turned off. Since T3 and T4 are connected to the nodes PD_P and PD_N respectively, the corresponding pull-up node PU and an output terminal in each stage are discharged alternatively via TFTs (T6, T1, T3) and (T7, T2, T4) when Vac1 or Vac2 is at a high level during two adjacent frames.

Figure 10:
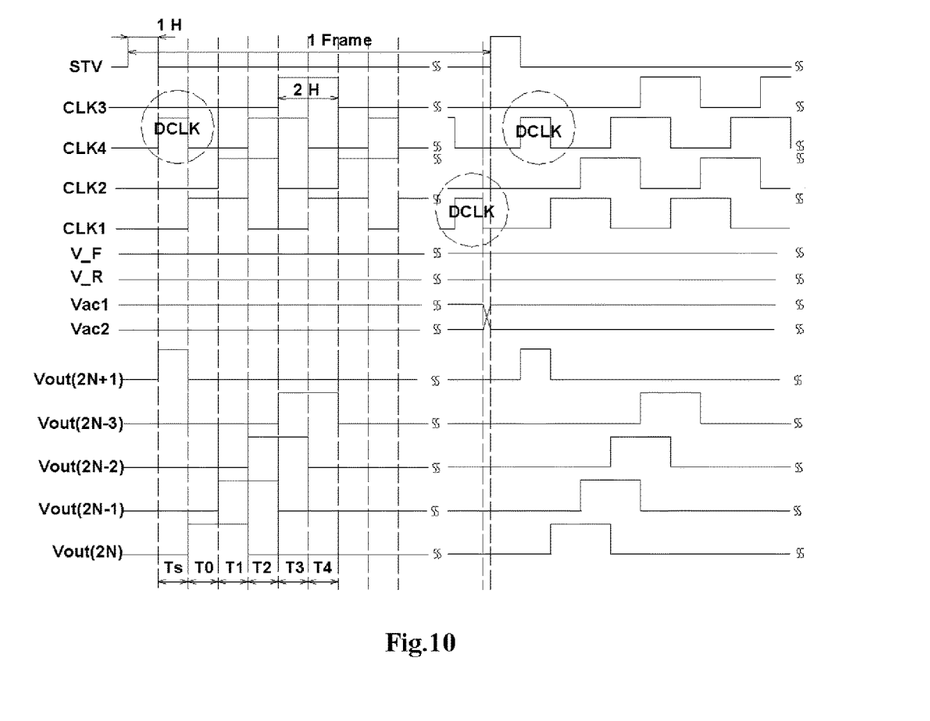
FIG. 10 is an operational timing diagram of the shift register unit according to the fifth embodiment of the present disclosure in a backward scanning.

FIG. 10 shows a timing diagram of a shift register unit according to an embodiment of the present disclosure in a backward scanning process. In the backward scanning, V_R is at a high level and V_F is at a low level, at this time the dummy pulse clock superposing on CLK4 is firstly output from SR2N+1 shown in FIG. 8, then respective high level pulses are output sequentially from the output terminals Vout(2N), Vout(2N−1), Vout(2N−2), Vout(2N−3), . . . , so that a backward scanning can be realized. Compared to the forward scanning process, in the backward scanning process, a high level signal is input from T9 to the node PU in each stage; while in the forward scanning process, the high level signal is input from T8 to the node PU. In the backward scanning process, it is also realized that when Vac1 or Vac2 is at a high level, the pull-up node PU and the output terminal of each stage are discharged alternatively via TFTs (T6, T1, T3) and (T7, T2, T4).

It should be understood that in the timing diagram shown in FIG. 9 and FIG. 10 the lasting time of the high level of Vac1 or Vac2 is 1 frame period. Actually, it can be realized that the pull-up node PU and the output terminal of each stage are discharged alternatively via TFTs (T6, T1, T3) and (T7, T2, T4) in the odd-numbered stage and even-numbered stage as long as the lasting time of the high level Vac1 or Vac2 is a certain integral times of the width of the pulse and is less than one frame period, and Vac1 and Vac2 have inverted phases to each other. The detailed timing diagram in this case will be omitted.

From the analysis on the timing diagram shown in FIG. 9 and FIG. 10, it can be known that the shift register unit shown in FIG. 5 can realize a bidirectional scanning function; compared to the connection structure of the conventional shift register unit, there are added clock control signals, two signal lines, dummy stages SR0 and SR2N+1, coupling between nodes PD_P, PD_N, T, and PU in the adjacent odd-numbered stage and even-numbered stage. More important, by the improved design of the circuits of shift register unit and the dummy stage unit, the pull-up node PU and the output terminal of each stage are discharged alternatively via the dummy stages of shift register units and the two sets of pull-down TFTs (T6, T1, T3) and TFTs (T7, T2, T4) when Vac1 or Vac2 is at a high level during different period (for example, two adjacent frame periods). Such a design reduces the gate bias of the pull-down TFTs (T6, T1, T3) and TFTs (T7, T2, T4), and improves the stability and lifespan of the shift register unit.

The aforesaid only illustrates some embodiments of the present disclosure, and it should be noted that a number of modifications and variations can be made to the embodiments of the present disclosure by those skilled in the art without departing from the spirit and principle of the present disclosure, and such modifications and variation should be regarded as falling into the protection scope of the present disclosure.

What is claimed is:
1. A shift register unit, comprising:
a pull-up module connected to a clock signal line and a signal output terminal;
at least two pull-down modules both connected to a low level signal line and the signal output terminal;
a control module connected to the pull-up module and the at least two pull-down modules, for controlling the pull-up module to be turned on, so that a high level signal input from the clock signal line is output to the signal output terminal, and for controlling the at least two pull-down modules to be turned on alternatively, so that a low level signal input from the low level signal line is output to the signal output terminal, and for controlling one of the at least two pull-down modules to be turned on while controlling the other pull-down modules of the at least two pull-down modules to be discharged, wherein the at least two pull-down modules comprise a first TFT and a second TFT, and the control module comprises a third TFT and a fourth TFT; and wherein a gate of the third TFT is connected to a gate of the first TFT, a drain of the third TFT is connected to a gate of the second TFT, and a source of the third TFT is connected to the low level signal line; a gate of the fourth TFT is connected to the gate of the second TFT, a drain of the fourth TFT is connected to the gate of the first TFT, and a source of the fourth TFT is connected to the low level signal line.

2. The shift register unit of claim 1, wherein drains of the first TFT and the second TFT are both connected to the signal output terminal, sources thereof are both connected to the low level signal line, the gate of the first TFT is connected to a first signal line, and the gate of the second TFT is connected to a second signal line, and a signal input from the first signal line and a signal input from the second signal line are level signals with inverted amplitudes.

3. The shift register unit of claim 2, wherein the control module further comprises a scan control sub-module, and the pull-up module comprises a fifth TFT and a capacitor, wherein a gate of the fifth TFT is connected to the scan control sub-module, a drain of the fifth TFT is connected to the clock signal line, and a source of the fifth TFT is connected to the signal output terminal; one terminal of the capacitor is connected to the gate of the fifth TFT, and the other terminal of the capacitor is connected to the drains of the first TFT and the second TFT.

4. The shift register unit of claim 3, wherein the control module comprises a sixth TFT, wherein a gate of the sixth TFT is connected to the gate of the first TFT, a drain of the sixth TFT is connected to the gate of the fifth TFT, and a source of the sixth TFT is connected to the low level signal line.

5. The shift register unit of claim 3, wherein the control module further comprises a seventh TFT, wherein a gate of the seventh TFT is connected to the gate of the second TFT, a drain of the seventh TFT is connected to the gate of the fifth TFT, and a source of the seventh TFT is connected to the low level signal line.

6. A gate driving circuit, comprising a plurality of shift registers units of claim 1 connected in cascade.

7. The gate driving circuit of claim 6, wherein the at least two pull-down modules comprise a first TFT and a second TFT, wherein drains of the first TFT and the second TFT are both connected to the signal output terminal, sources thereof are both connected to the low level signal line, a gate of the first TFT is connected to a first signal line, and a gate of the second TFT is connected to a second signal line, and a signal input from the first signal line and a signal input from the second signal line are level signals with inverted amplitudes.

8. The gate driving circuit of claim 7, wherein, in a case where the shift register unit is an odd-numbered stage of shift register unit, the gate of the first TFT therein is connected to the gate of the second TFT in a next stage of shift register unit, the gate of the second TFT therein is connected to the gate of the first TFT in the next stage of shift register unit;

in a case where the shift register unit is an even-numbered stage of shift register unit, the gate of the first TFT therein is connected to the gate of the second TFT in a previous stage of shift register unit, the gate of the second TFT therein is connected to the gate of the first TFT in the previous stage of shift register unit; the gate of the first TFT in the odd-numbered stage of shift register unit is connected to the first signal line, and the gate of the first TFT in the even-numbered stage of shift register unit is connected to the second signal line.

9. The gate driving circuit of claim 7, wherein the control module comprises a third TFT and a fourth TFT, wherein a gate of the third TFT is connected to the gate of the first TFT, a drain of the third TFT is connected to the gate of the second TFT, and a source of the third TFT is connected to the low level signal line; a gate of the fourth TFT is connected to the gate of the second TFT, a drain of the fourth TFT is connected to the gate of the first TFT, and a source of the fourth TFT is connected to the low level signal line; and the control module further comprises a scan control sub-module, and the pull-up module comprises a fifth TFT and a capacitor, wherein a gate of the fifth TFT is connected to the scan control sub-module, a drain of the fifth TFT is connected to the clock signal line, and a source of the fifth TFT is connected to the signal output terminal; one terminal of the capacitor is connected to the gate of the fifth TFT, and the other terminal of the capacitor is connected to the drains of the first TFT and the second TFT.

10. The gate driving circuit of claim 9, wherein the scan control sub-module comprises an eighth TFT and a ninth TFT;

in the case where the shift register unit is an odd-numbered stage of shift register unit, a gate of the eighth TFT is connected to a signal output terminal of a previous odd-numbered stage of shift register unit, a drain of the eighth TFT is connected to a forward scan control signal line, and a source of the eighth TFT is connected to the gate of the fifth TFT, a gate of the ninth TFT is connected to a signal output terminal of a next odd-numbered stage of shift register unit, a drain of the ninth TFT is connected to a backward scan control signal line, and a source of the ninth TFT is connected to the gate of the fifth TFT;

in the case where the shift register unit is an even-numbered stage of shift register unit, the gate of the eighth TFT is connected to a signal output terminal of a previous even-numbered stage of shift register unit, the drain of the eighth TFT is connected to the forward scan control signal line, and the source of the eighth TFT is connected to the gate of the fifth TFT, the gate of the ninth TFT is connected to a signal output terminal of a next even-numbered stage of shift register unit, the drain of the ninth TFT is connected to the backward scan control signal line, and the source of the ninth TFT is connected to the gate of the fifth TFT.

11. The gate driving circuit of claim 9, wherein the shift register unit further comprises a thirteenth TFT and a fourteenth TFT;

in the case where the shift register unit is an odd-numbered stage of shift register unit, gates of the thirteenth TFT and the fourteenth TFT are both connected to the gate of the fifth TFT in a previous stage of shift register unit, and sources of the thirteenth TFT and the fourteenth TFT are both connected to the low level signal line, a drain of the thirteenth TFT is connected to the gate of the first TFT in the present stage of shift register unit, a drain of the fourteenth TFT is connected to the gate of the second TFT in the present stage of shift register unit, and the gate of the fifth TFT in the present stage of shift register unit is connected to the gates of the thirteenth TFT and the fourteenth TFT in the previous stage of shift register unit;

in the case where the shift register unit is an even-numbered stage of shift register unit, gates of the thirteenth TFT and the fourteenth TFT are both connected to the gate of the fifth TFT in a next stage of shift register unit, and sources of the thirteenth TFT and the fourteenth TFT are both connected to the low level signal line, a drain of the thirteenth TFT is connected to the gate of the first TFT in the present stage of shift register unit, a drain of the fourteenth TFT is connected to the gate of the second TFT in the present stage of shift register unit, and the gate of the fifth TFT in the present stage of shift register unit is connected to the gates of the thirteenth TFT and the fourteenth TFT in the next stage of shift register unit.

12. The gate driving circuit of claim 7, wherein the control module further comprises a tenth TFT, an eleventh TFT and a twelfth TFT;
  in a case where the shift register unit is an odd-numbered stage of shift register unit, a gate and a drain of the tenth TFT are both connected to the first signal line, a source of the tenth TFT is connected to a drain of the twelfth TFT; a gate of the twelfth TFT is connected to a signal output terminal of a previous odd-numbered stage of shift register unit, and a source of the twelfth TFT is connected to the low level signal line; a gate of the eleventh TFT is connected to the drain of the twelfth TFT, a drain of the eleventh TFT is connected to the first signal line, and a source of the eleventh TFT is connected to the gate of the first TFT;
  in a case where the shift register unit is an even-numbered stage of shift register unit, a gate and a drain of the tenth TFT are both connected to the second signal line, a source of the tenth TFT is connected to a drain of the twelfth TFT; a gate of the twelfth TFT is connected to a signal output terminal of a previous even-numbered stage of shift register unit, and a source of the twelfth TFT is connected to the low level signal line; a gate of the eleventh TFT is connected to the drain of the twelfth TFT, a drain of the eleventh TFT is connected to the second signal line, and a source of the eleventh TFT is connected to the gate of the second TFT.

13. The gate driving circuit of claim 6, wherein the gate driving circuit comprises four clock signal lines, wherein the four clock signal lines are connected sequentially to four adjacent shift register units.

14. A display device, comprising the gate driving circuit of claim 6.

15. The display device of claim 14, wherein the at least two pull-down modules comprise a first TFT and a second TFT, wherein drains of the first TFT and the second TFT are both connected to the signal output terminal, sources thereof are both connected to the low level signal line, a gate of the first TFT is connected to a first signal line, and a gate of the second TFT is connected to a second signal line, and a signal input from the first signal line and a signal input from the second signal line are level signals with inverted amplitudes, and characterized in that,
  in a case where the shift register unit is an odd-numbered stage of shift register unit, the gate of the first TFT therein is connected to the gate of the second TFT in a next stage of shift register unit, the gate of the second TFT therein is connected to the gate of the first TFT in the next stage of shift register unit;
  in a case where the shift register unit is an even-numbered stage of shift register unit, the gate of the first TFT therein is connected to the gate of the second TFT in a previous stage of shift register unit, the gate of the second TFT therein is connected to the gate of the first TFT in the previous stage of shift register unit; the gate of the first TFT in the odd-numbered stage of shift register unit is connected to the first signal line, and the gate of the first TFT in the even-numbered stage of shift register unit is connected to the second signal line.

16. The display device of claim 15, wherein the control module comprises a third TFT and a fourth TFT, wherein a gate of the third TFT is connected to the gate of the first TFT, a drain of the third TFT is connected to the gate of the second TFT, and a source of the third TFT is connected to the low level signal line; a gate of the fourth TFT is connected to the gate of the second TFT, a drain of the fourth TFT is connected to the gate of the first TFT, and a source of the fourth TFT is connected to the low level signal line; and
  the control module further comprises a scan control sub-module, and the pull-up module comprises a fifth TFT and a capacitor, wherein a gate of the fifth TFT is connected to the scan control sub-module, a drain of the fifth TFT is connected to the clock signal line, and a source of the fifth TFT is connected to the signal output terminal; one terminal of the capacitor is connected to the gate of the fifth TFT, and the other terminal of the capacitor is connected to the drains of the first TFT and the second TFT.

17. The display device of claim 16, wherein the scan control sub-module comprises an eighth TFT and a ninth TFT;
  in the case where the shift register unit is an odd-numbered stage of shift register unit, a gate of the eighth TFT is connected to a signal output terminal of a previous odd-numbered stage of shift register unit, a drain of the eighth TFT is connected to a forward scan control signal line, and a source of the eighth TFT is connected to the gate of the fifth TFT, a gate of the ninth TFT is connected to a signal output terminal of a next odd-numbered stage of shift register unit, a drain of the ninth TFT is connected to a backward scan control signal line, and a source of the ninth TFT is connected to the gate of the fifth TFT;
  in the case where the shift register unit is an even-numbered stage of shift register unit, the gate of the eighth TFT is connected to a signal output terminal of a previous even-numbered stage of shift register unit, the drain of the eighth TFT is connected to the forward scan control signal line, and the source of the eighth TFT is connected to the gate of the fifth TFT, the gate of the ninth TFT is connected to a signal output terminal of a next even-numbered stage of shift register unit, the drain of the ninth TFT is connected to the backward scan control signal line, and the source of the ninth TFT is connected to the gate of the fifth TFT.

18. The display device of claim 15, wherein the control module further comprises a tenth TFT, an eleventh TFT and a twelfth TFT;
  in a case where the shift register unit is an odd-numbered stage of shift register unit, a gate and a drain of the tenth TFT are both connected to the first signal line, a source of the tenth TFT is connected to a drain of the twelfth TFT; a gate of the twelfth TFT is connected to a signal output terminal of a previous odd-numbered stage of shift register unit, and a source of the twelfth TFT is connected to the low level signal line; a gate of the eleventh TFT is connected to the drain of the twelfth TFT, a drain of the eleventh TFT is connected to the first signal line, and a source of the eleventh TFT is connected to the gate of the first TFT;

in a case where the shift register unit is an even-numbered stage of shift register unit, a gate and a drain of the tenth TFT are both connected to the second signal line, a source of the tenth TFT are connected to a drain of the twelfth TFT; a gate of the twelfth TFT is connected to a signal output terminal of a previous even-numbered stage of shift register unit, and a source of the twelfth TFT is connected to the low level signal one; a gate of the eleventh TFT is connected to the drain of the twelfth TFT, a drain of the eleventh TFT is connected to the second signal line, and a source of the eleventh TFT is connected to the gate of the second TFT.

19. The display device of claim 18, wherein the shift register unit further comprises a thirteenth TFT and a fourteenth TFT;

in the case where the shift register unit is an odd-numbered stage of shift register unit, gates of the thirteenth TFT and the fourteenth TFT are both connected to the gate of the fifth TFT in a previous stage of shift register unit, and sources of the thirteenth TFT and the fourteenth TFT are both connected to the low level signal line, a drain of the thirteenth TFT is connected to the gate of the first TFT in the present stage of shift register unit, a drain of the fourteenth TFT is connected to the gate of the second TFT in the present stage of shift register unit, and the gate of the fifth TFT in the present stage of shift register unit is connected to the gates of the thirteenth TFT and the fourteenth TFT in the previous stage of shift register unit;

in the case where the shift register unit is an even-numbered stage of shift register unit, gates of the thirteenth TFT and the fourteenth TFT are both connected to the gate of the fifth TFT in a next stage of shift register unit, and sources of the thirteenth TFT and the fourteenth TFT are both connected to the low level signal line, a drain of the thirteenth TFT is connected to the gate of the first TFT in the present stage of shift register unit, a drain of the fourteenth TFT is connected to the gate of the second TFT in the present stage of shift register unit, and the gate of the fifth TFT in the present stage of shift register unit is connected to the gates of the thirteenth TFT and the fourteenth TFT in the next stage of shift register unit.

* * * * *